(12) United States Patent
Ogiwara et al.

(10) Patent No.: US 10,803,932 B1
(45) Date of Patent: Oct. 13, 2020

(54) STORAGE DEVICE

(71) Applicant: TOSHIBA MEMORY CORPORATION, Minato-ku, Tokyo (JP)

(72) Inventors: Ryu Ogiwara, Yokohama Kanagawa (JP); Daisaburo Takashima, Yokohama Kanagawa (JP); Takahiko Iizuka, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/559,370

(22) Filed: Sep. 3, 2019

(30) Foreign Application Priority Data

Mar. 20, 2019 (JP) .................................. 2019-053481

(51) Int. Cl.
*G11C 11/56* (2006.01)
*G11C 13/00* (2006.01)

(52) U.S. Cl.
CPC ...... *G11C 11/5678* (2013.01); *G11C 11/5614* (2013.01); *G11C 13/003* (2013.01); *G11C 13/0004* (2013.01); *G11C 13/0011* (2013.01); *G11C 2213/72* (2013.01); *G11C 2213/79* (2013.01)

(58) Field of Classification Search
None
See application file for complete search history.

(56) References Cited

U.S. PATENT DOCUMENTS

| | | | |
|---|---|---|---|
| 5,969,340 A | 10/1999 | Dragne | |
| 2007/0285999 A1* | 12/2007 | Di Vincenzo | G11C 16/26 365/189.09 |
| 2008/0054163 A1 | 3/2008 | Suzunaga | |
| 2010/0220514 A1* | 9/2010 | Vigoda | G11C 13/0069 365/149 |

(Continued)

FOREIGN PATENT DOCUMENTS

JP    H07-159426 A    6/1995

OTHER PUBLICATIONS

Chan et al., "Superior Multilevel Resistive Switching Behaviors of N$_2$-Plasma-Treated Stacked SiN$_x$/GdO$_x$ RRAMs", 2018 International Conference on Solid State Devices and Materials, Tokyo, 2018, pp. 93-94.

(Continued)

*Primary Examiner* — Tan T. Nguyen
(74) *Attorney, Agent, or Firm* — Foley & Lardner LLP

(57) ABSTRACT

According to one embodiment, a storage device includes: a memory cell including a storage component to which a plurality of data values are allowed to set in response to a plurality of resistance values of the storage component and a selector connected in series to the storage component; a word line configured to provide a signal to select the memory cell; a bit line configured to receive a data signal from the memory cell; a first conversion circuit configured to nonlinearly convert a first current, generated in response to the data signal input to the bit line, into a first voltage; and a comparison circuit configured to compare the first voltage, converted by the first conversion circuit, with a plurality of reference voltages.

15 Claims, 10 Drawing Sheets

(56) References Cited

U.S. PATENT DOCUMENTS

2016/0013806 A1* 1/2016 Heldeis ............... H03M 11/003
                                                        341/24
2016/0308496 A1* 10/2016 Isoda ..................... H03F 3/087

OTHER PUBLICATIONS

Tominaga et al., "Electrical-field induced giant magnetoresistivity in (non-magnetic) phase change films" AIP Applied Physics Letters, 99, 152105 (2011).

* cited by examiner

STORAGE DEVICE

CROSS-REFERENCE TO RELATED APPLICATION

This application is based upon and claims the benefit of priority from Japanese Patent Application No. 2019-053481, filed Mar. 20, 2019, the entire contents of which are incorporated herein by reference.

FIELD

Embodiments described herein relate generally to a storage device.

BACKGROUND

A storage device (semiconductor integrated circuit device) configured such that resistance change storage elements such as PCM (phase change memory) elements or iPCM (interfacial phase change memory) elements are integrated on a semiconductor substrate has been proposed.

To achieve multivalued storage in the storage device using the resistance change storage elements described above, existing storage devices are not entirely satisfactory.

Examples of related art include JP-A-H07-159426 and 2018 International Conference on Solid State Devices and Materials, Tokyo, 2018, pp 93-94 Superior Multilevel Resistive Switching Behaviors of N2-Plasma-Treated Stacked SiNx/GdOx RRAMs Ya-Ting Chan1, Yi Fu1, Tzu-Ming Chu1, and Jer-Chyi Wang1,2,3,* 1Department of Electronic Engineering, Chang Gung University, Guishan Dist. 33302, Taoyuan, Taiwan. 2Department of Neurosurgery, Chang Gung Memorial Hospital, Guishan Dist. 33305, Taoyuan, Taiwan. 3Department of Electronic Engineering, Ming Chi University of Technology, Taishan Dist. 24301, New Taipei City, Taiwan. Phone: +886-3-2118800 ext.5784 E-mail: jcwang@mail.cgu.edu.tw

DETAILED DESCRIPTION

An embodiment provides appropriate multivalued storage in a storage device using a resistance change storage element.

In general, according to one embodiment, a storage device includes: a memory cell including a storage component configured to set a plurality of data values in response to a plurality of resistance values and a selector connected in series to the storage component; a word line configured to provide a signal to select the memory cell; a bit line configured to receive a data signal from the memory cell; a first conversion circuit configured to nonlinearly convert a first current, generated in response to the data signal input to the bit line, into a first voltage; and a comparison circuit configured to compare the first voltage with at least one of a plurality of reference voltages.

An embodiment will be described hereinafter with reference to the drawings.

Figure 1:
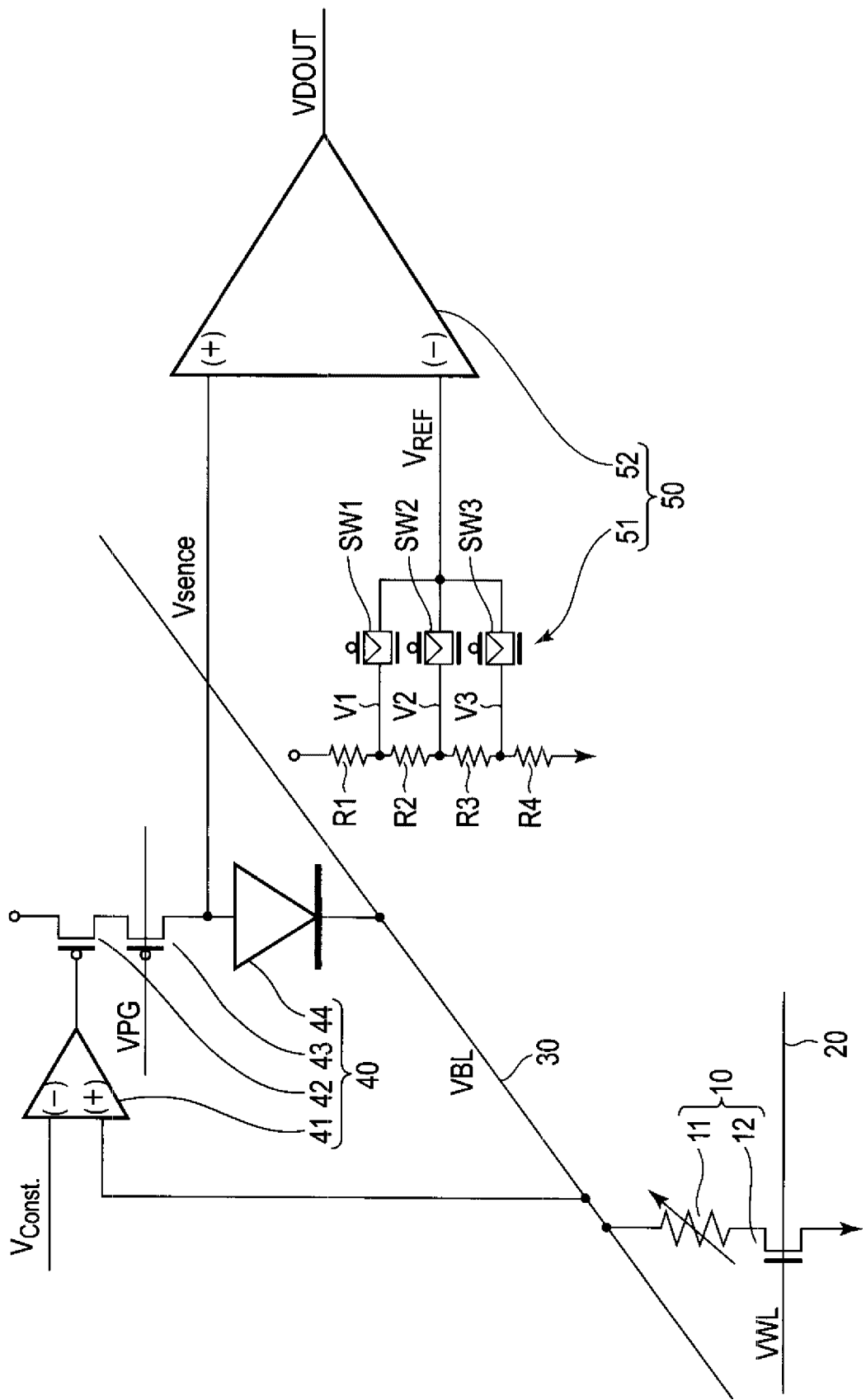
FIG. 1 is a circuit diagram depicting a configuration of a storage device according to an embodiment.

FIG. 1 is a circuit diagram depicting a configuration of a storage device according to the embodiment.

The storage device according to the present embodiment includes a memory cell 10, a word line 20, a bit line 30, a conversion circuit (logarithmic amplifier circuit) 40, and a comparison circuit 50.

The memory cell 10 includes a resistance change storage element (or a storage component) 11 to which a plurality of data values can be set in response to resistance values, and a selection element (or a selector) connected in series to the resistance change storage element 11.

For example, a resistance change storage element, to which a plurality of resistance states in response to falling speeds of an applied voltage can be set, may be used as the resistance change storage element 11. Specifically, the resistance change storage element 11 can include at least one of: a PCM (phase change memory) element, an iPCM (interfacial phase change memory) element, an ReRAM (resistive random access memory) element, or a CBRAM (conductive bridge random access memory).

The selection element 12 selects the resistance change storage element 11, and a two-terminal element or a three-terminal element is used as the selection element 12. In the example depicted in FIG. 1, a MOS transistor that is the three-terminal element is used as the selection element 12.

The word line 20 is connected to the memory cell 10. Specifically, the word line 20 is connected to a gate of the MOS transistor (selection element 12), and a signal for selecting the memory cell 10 is supplied to the word line 20. That is, when a selection signal VWL is applied to the word line 20, the MOS transistor (selection element 12) is turned on and the resistance change storage element 11 is selected. As a result, data can be written to or read from the resistance change storage element 11.

The bit line 30 to which a data signal from the memory cell 10 is input is connected to the memory cell 10. In other words, when the memory cell 10 is selected as described above, data is written to or read from the selected memory cell 10 via the bit line 30 connected to the selected memory cell 10.

The conversion circuit 40 that nonlinearly converts a current in response to the data signal input to the bit line is connected to the bit line 30. For example, the conversion circuit 40 logarithmically converts the current input to the bit line 30 into a voltage.

The conversion circuit 40 includes an operational amplifier 41, PMOS transistors 42 and 43, and a conversion element 44. The conversion element 44 has a nonlinear voltage-current characteristic, nonlinearly converts the input current into the voltage, and outputs the voltage. The comparison circuit 50, to be described later, is connected to an input terminal of the conversion element 44, and the bit line 30 is connected to an output terminal of the conversion element 44. Turning on the PMOS transistor 43 by a signal VPG enables the conversion circuit 40 to operate as described above.

In an example depicted in FIG. 1, a two-terminal element (or two-terminal component) having a nonlinear voltage-current characteristic is used as the conversion element 44.

As the two-terminal element, a diode or a selector that contains a chalcogen element may be used.

The selector that contains the chalcogen element turns into a high resistance state when a voltage applied across two terminals is lower than a threshold voltage, and turns into a low resistance state when the voltage applied across the two terminals is higher than the threshold voltage. The selector may contain at least one chalcogen element selected from among Te, Se, and S, or a chalcogenide that is a compound containing these chalcogen elements. Furthermore, the selector may contain at least one element selected from among B, Al, Ga, In, C, Si, Ge, Sn, As, P, and Sb.

The comparison circuit 50 is connected to the conversion circuit 40. The comparison circuit 50 compares the voltage into which the current is converted by the conversion circuit 40 with a plurality of reference voltages. The comparison circuit 50 includes a reference voltage generation circuit block 51 and an operational amplifier 52.

The reference voltage generation circuit block 51 generates a plurality of reference voltages, and includes a voltage-dividing circuit configured with a plurality of resistors (R1, R2, R3, and R4) connected in series and a switch circuit configured with a plurality of switch elements (SW1, SW2, SW3). Turning on any of the switch elements SW1, SW2, and SW3 enables any of voltages V1, V2, and V3 obtained by the voltage-dividing circuit to be supplied to an inverting input terminal of the operational amplifier 52 as a reference voltage VREF.

A voltage Vsense into which the current is converted by the conversion circuit 40 is input to a non-inverting input terminal of the operational amplifier 52. The operational amplifier 52 compares the voltage Vsense input to the non-inverting input terminal with the reference voltage VREF (voltage V1, V2, or V3) input to the inverting input terminal, and outputs an output signal (output voltage VDOUT) based on a comparison result from an output terminal.

In the present embodiment, the conversion circuit 40 nonlinearly converts the current from the bit line 30 into the voltage and supplies the resultant voltage to the comparison circuit 50 as described above. Such a configuration makes it possible to achieve appropriate multivalued storage. The description will be additionally given below.

Figure 2:
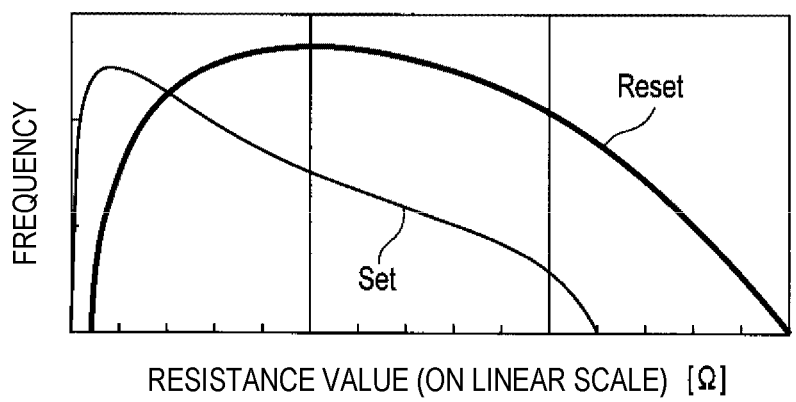
FIG. 2 schematically depicts frequency distributions of resistance values of a resistance change storage element when a PCM element or an iPCM element is used as the resistance change storage element.

FIG. 2 schematically depicts frequency distributions of resistance values of the resistance change storage element when the PCM element or the iPCM element is used as the resistance change storage element. A horizontal axis indicates a resistance value and a vertical axis indicates a frequency (appearance frequency). The horizontal axis (resistance value) is represented on a linear scale. In general, the PCM element and the iPCM element each has two states, for example, a low resistance state (Set state) and a high resistance state (Reset state). FIG. 2 schematically depicts the frequency distribution of the resistance value in a case of performing Set write and the frequency distribution of the resistance value in a case of performing Reset write.

Figure 3:
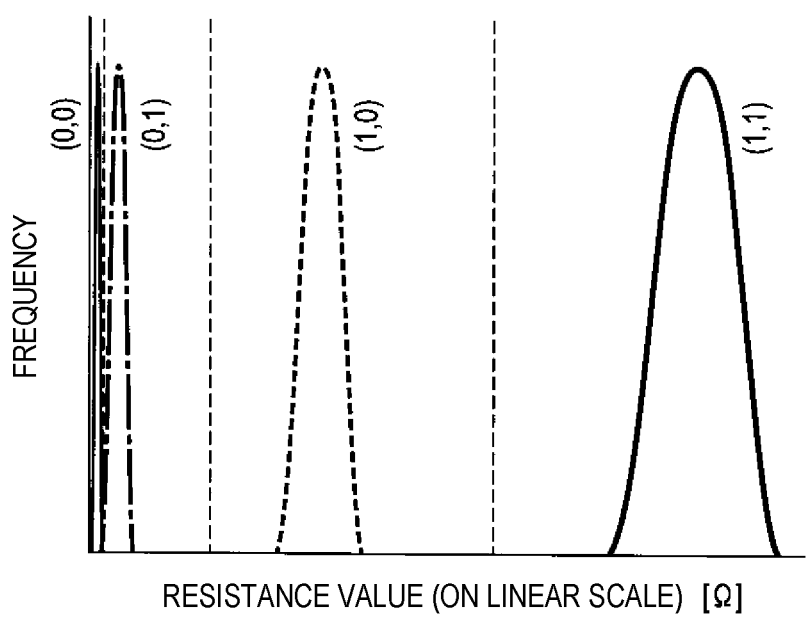
FIG. 3 schematically depicts a resistance distribution characteristic in a case of an attempt to achieve multivalued storage using the resistance change storage element having a characteristic depicted in FIG. 2.

As depicted in FIG. 2, the resistance value of the resistance change storage element relatively has a wider distribution on a low resistance value side in the case of performing each of the Set write and the Reset write. Therefore, in a case of an attempt to achieve multivalued storage using the resistance change storage element 11 having such a resistance distribution characteristic, a resistance distribution characteristic as depicted in FIG. 3 is conceivable. Specifically, in a case of the attempt to achieve the multivalued storage by repeating writing and verification until the resistance value of the resistance change storage element 11 is set in a resistance value range corresponding to a desired data value ((0,0), (0,1), (1,0), or (1,1) in an example of FIG. 3), it is conceivable that resistance distribution characteristic as depicted in FIG. 3 is obtained. With such a resistance distribution characteristic, the resistance value range is extremely narrow on the low resistance value side; thus, it is difficult to perform an accurate read operation.

Figure 4:
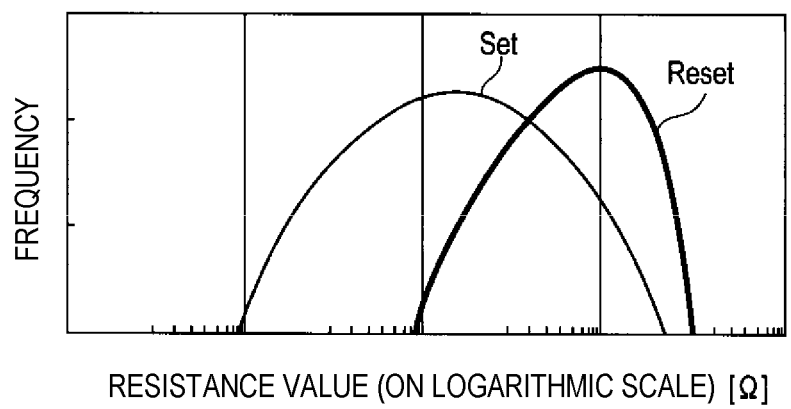
FIG. 4 is a chart representing resistance values on a logarithmic scale, as opposed to the frequency distributions of the resistance values of FIG. 2.

FIG. 4 represents the horizontal axis (resistance value) on a logarithmic scale, as opposed to the resistance distribution characteristic of FIG. 2. As depicted in FIG. 4, when the horizontal axis (resistance value) is represented on a logarithmic scale, it appears that the resistance distribution characteristic (frequency distribution) is averaged, compared with the case of FIG. 2 where the horizontal axis (resistance value) is represented on a linear scale.

Figure 5:
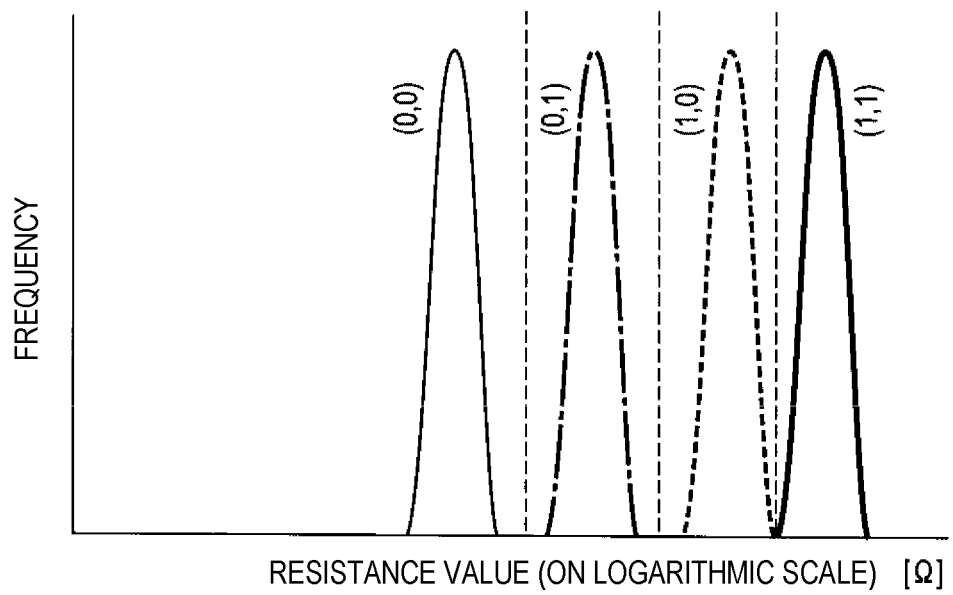
FIG. 5 schematically depicts a resistance distribution characteristic in a case of an attempt to achieve the multivalued storage using the resistance change storage element having a characteristic depicted in FIG. 4.

Taking this into consideration, when the horizontal axis is represented on a logarithmic scale, it is conceivable that the resistance distribution characteristic of the multivalued storage depicted in FIG. 3 is changed to that depicted in FIG. 5. That is, it appears that the resistance value ranges (resistance value ranges corresponding to the data values (0,0), (0,1), (1,0), and (1,1), respectively of the resistance distribution characteristic) are equalized.

In the present embodiment, the conversion circuit 40 that nonlinearly converting the current from the bit line 30 into the voltage is provided on the basis of a content described above. As depicted in FIG. 5, it is thereby possible to equalize the resistance value distributions of the resistance distribution characteristic in a logarithmic graph. This also enables the comparison circuit 50 to use the equalized reference voltages (V1, V2, or V3), so that the comparison circuit 50 can perform a precise comparison operation. In the present embodiment, therefore, it is possible to perform a precise read operation and achieve a nonvolatile storage device capable of appropriate multivalued storage.

Various modifications of the present embodiment will next be described.

Figure 6:
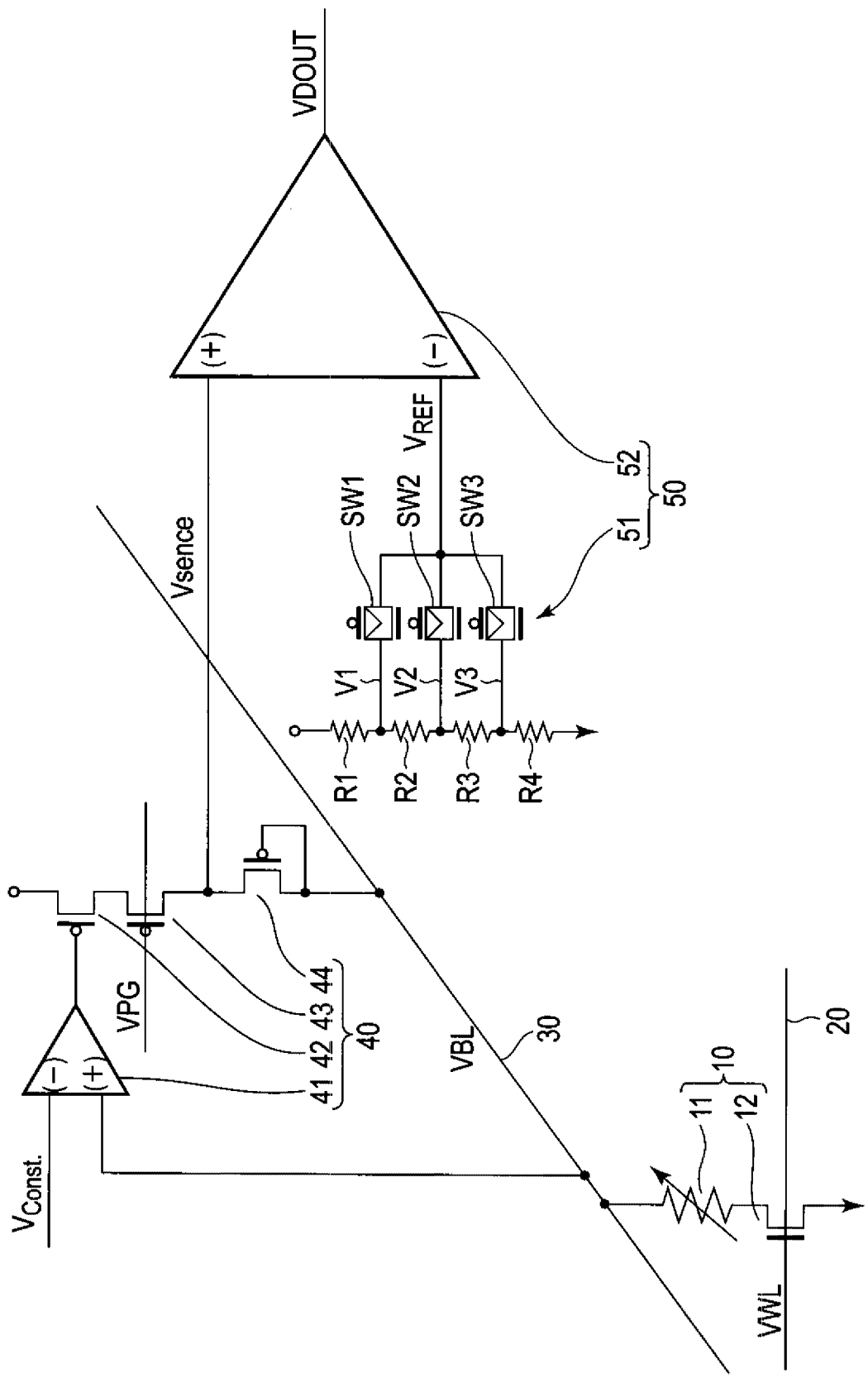
FIG. 6 is a circuit diagram depicting a configuration of a first modification of the storage device according to the embodiment.

FIG. 6 is a circuit configuration depicting a configuration of a first modification of the storage device according to the present embodiment. In the present configuration example, a diode-connected three-terminal element (or diode-connected three-terminal component) is used as the conversion element 44. Specifically, a PMOS transistor having a gate and a drain connected to each other is used as the conversion element 44. Even with such a configuration, similar operations to those in the embodiment can be achieved and similar advantages to those of the embodiment can be obtained.

Figure 7:
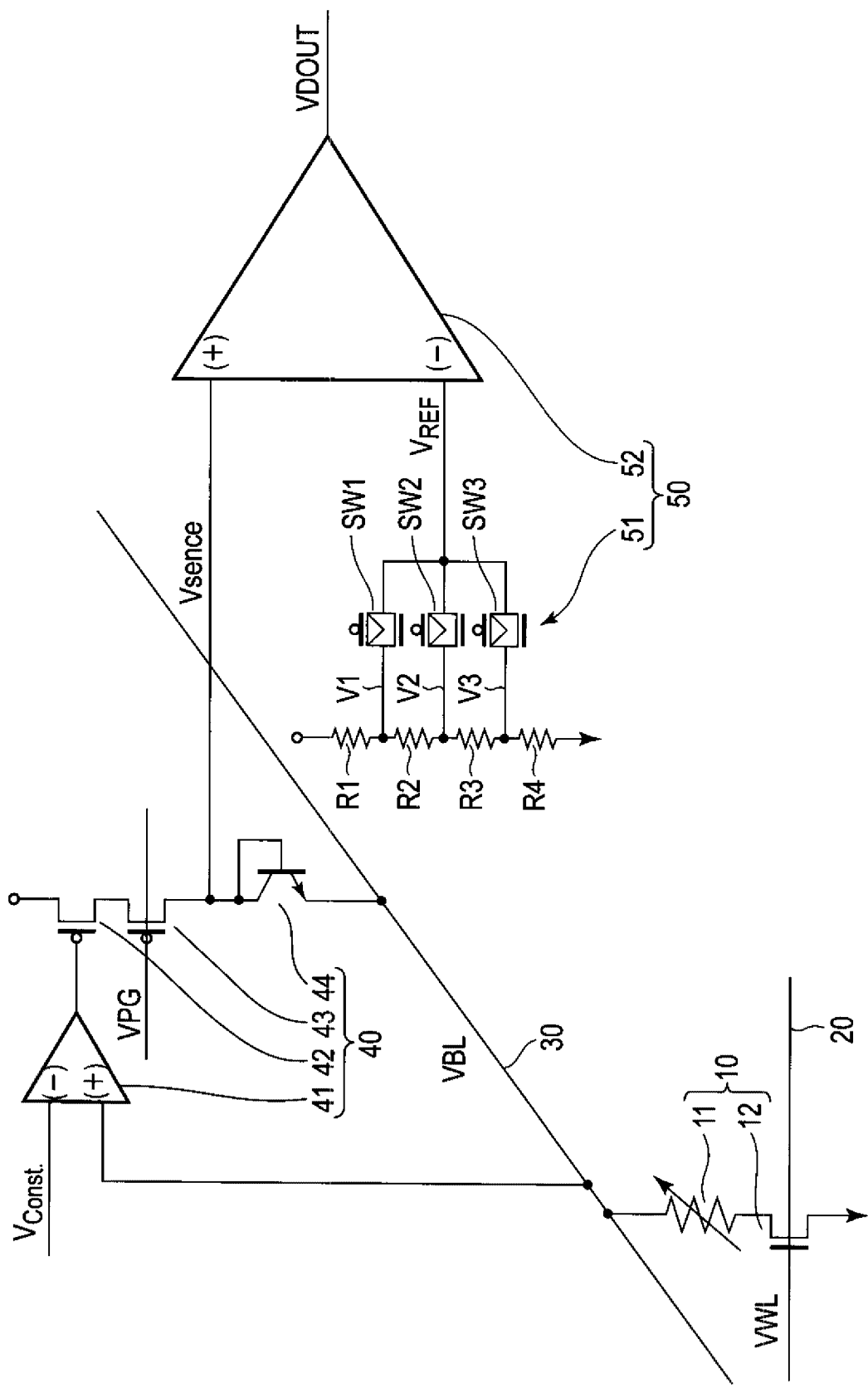
FIG. 7 is a circuit diagram depicting a configuration of a second modification of the storage device according to the embodiment.

FIG. 7 is a circuit configuration depicting a configuration of a second modification of the storage device according to the present embodiment. In the present configuration example similarly to the first modification, a diode-connected three-terminal element is used as the conversion element 44. Specifically, a bipolar transistor having a base and a collector connected to each other is used as the conversion element 44. Even with such a configuration, similar operations to those in the embodiment can be achieved and similar advantages to those of the embodiment can be obtained.

Figure 8:
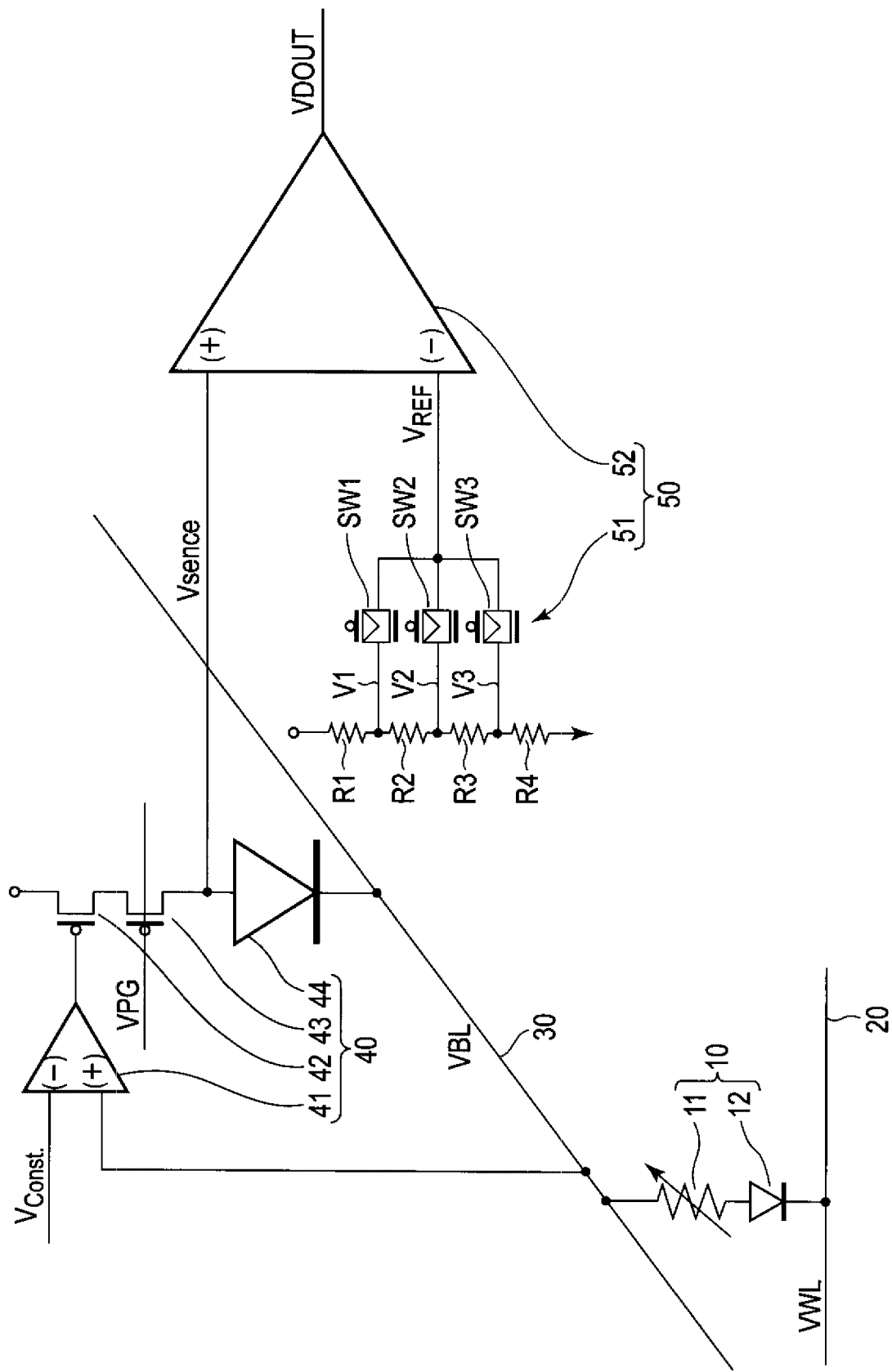
FIG. 8 is a circuit diagram depicting a configuration of a third modification of the storage device according to the embodiment.

FIG. 8 is a circuit configuration depicting a configuration of a third modification of the storage device according to the present embodiment. In an example of the present configuration, a two-terminal element is used as the selection element 12. Specifically, a selector that is the two-terminal element having a nonlinear voltage-current characteristic and that may be a diode or may contain a chalcogen element is used as the switching element. As the two-terminal element used as the selection element 12, the diode or a selector as illustrated with reference to FIG. 1 or the selector that contains the chalcogen element as illustrated in the present modification may be used.

In a case of using the two-terminal element as the selection element 12 as described in the present modification, a terminal that is not connected to the resistance change storage element 11 out of two terminals of the selection element 12 is connected to the word line 20. Applying the selection signal VWL to the word line 20 to turn on the selection element 12 makes it possible to select the memory cell 10 and to write or read data to or from the resistance change storage element 11.

It is noted that a configuration of combining the first, second, and third modifications as appropriate may also be adopted.

Furthermore, the reference voltage generation circuit block 51 in the comparison circuit 50 divides a power supply voltage by resistances and generates the reference voltages in the embodiment and the modifications described above. However, since the diode, the PMOS transistor, and the bipolar transistor have temperature dependence, the generated reference voltages may be subjected to temperature dependence.

FIGS. 9, 10, 11, and 12 are circuit diagrams depicting configurations of first, second, third, and fourth modifications of the reference voltage generation circuit block 51, respectively. In any of the modifications, the reference voltage generation circuit block 51 is configured to generate the reference voltages having the temperature dependence.

Figure 9:
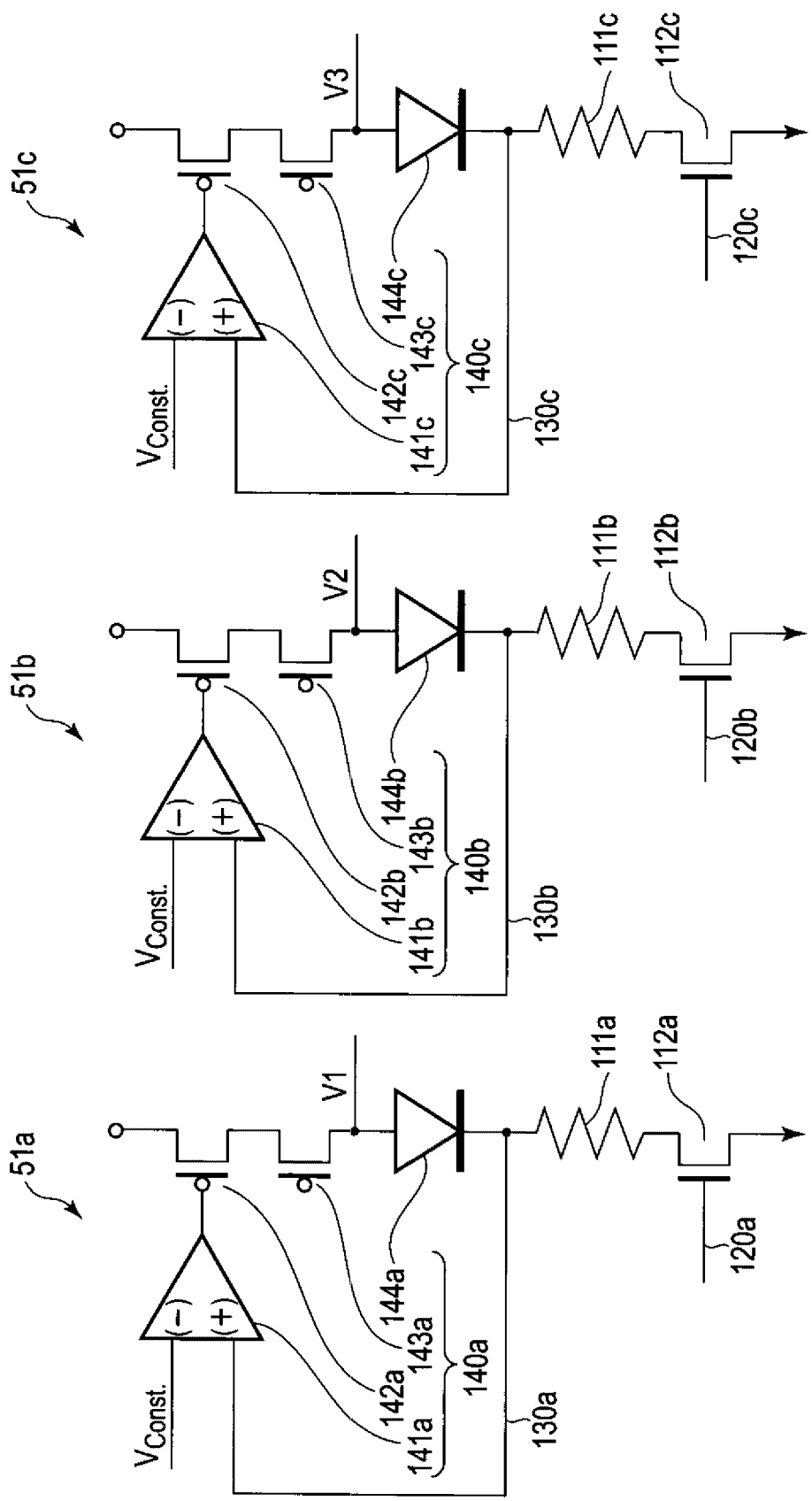
FIG. 9 is a circuit diagram depicting a configuration of a first modification of a reference voltage generation circuit block in the storage device according to the embodiment.

In the first modification depicted in FIG. 9, the reference voltage generation circuit block 51 includes a plurality of reference voltage generation circuits 51*a*, 51*b*, and 51*c*.

The reference voltage generation circuit 51*a* includes a reference resistance element (or reference resistor) 111*a*, a reference selection element (or reference selector) 112*a* connected in series to the reference resistance element 111*a*, a reference word line 120*a* to which a signal for selecting the reference selection element 112*a* is supplied, a reference bit line 130*a* to which a reference current is input from the reference resistance element 111*a*, and a conversion circuit 140*a* that nonlinearly converts the reference current input to the reference bit line 130*a* into a reference voltage. The conversion circuit 140*a* includes an operational amplifier 141*a*, PMOS transistors 142*a* and 143*a*, and a conversion element 144*a*.

Basic configurations of the reference voltage generation circuits 51*b* and 51*c* are similar to that of the reference voltage generation circuit 51*a*. That is, the reference voltage generation circuit 51*b* includes a reference resistance element 111*b*, a reference selection element 112*b*, a reference word line 120*b*, a reference bit line 130*b*, and a conversion circuit 140*b* (an operational amplifier 141*b*, PMOS transistors 142*b* and 143*b*, and a conversion element 144*b*). The reference voltage generation circuit 51*c* includes a reference resistance element 111*c*, a reference selection element 112*c*, a reference word line 120*c*, a reference bit line 130*c*, and a conversion circuit 140*c* (an operational amplifier 141*c*, PMOS transistors 142*c* and 143*c*, and a conversion element 144*c*).

The conversion circuits 140*a*, 140*b*, and 140*c* described above have the same circuit configuration and the same circuit characteristic as those of the conversion circuit 40 depicted in FIG. 1. Any of the reference voltages V1, V2, and V3 generated by the conversion circuit 140*a*, 140*b*, and 140*c* is supplied to the inverting input terminal of the operational amplifier 52 depicted in FIG. 1 via any of the switch elements SW1, SW2, and SW3 depicted in FIG. 1.

In the configuration described above, it is assumed that a resistance value of the reference resistance element 111*a* is Ra, a resistance value of the reference resistance element 111*b* is Rb, and a resistance value of the reference resistance element 111*c* is Rc. Furthermore, it is assumed that for the resistance distribution characteristic of the resistance change storage element 11 depicted in 1, a resistance value at a center of a resistance distribution characteristic part corresponding to the data value (0,0) is $R_{(0,0)}$, a resistance value at a center of a resistance distribution characteristic part corresponding to the data value (0,1) is $R_{(0,1)}$, a resistance value at a center of a resistance distribution characteristic part corresponding to the data value (1,0) is $R_{(1,0)}$, and a resistance value at a center of a resistance distribution characteristic part corresponding to the data value (1,1) is $R_{(1,1)}$.

In this case, the resistance values $R_{(0,0)}$, $R_{(0,1)}$, $R_{(1,0)}$, and $R_{(1,1)}$ are set to satisfy the following equations.

$$\log Ra = (\log R_{(1,1)} + \log R_{(1,0)})/2$$

$$\log Rb = (\log R_{(1,0)} + \log R_{(0,1)})/2$$

$$\log Rc = (\log R_{(0,1)} + \log R_{(0,0)})/2$$

Setting the resistance values in this way makes it possible to optimize the resistance values Ra, Rb, and Rc of the reference resistance elements 111*a*, 111*b*, and 111*c* in FIG. 5 (on a logarithmic scale) even if a temperature changes. That is, in FIG. 5 (on a logarithmic scale), it is possible to locate the resistance value Ra of the reference resistance element 111*a* at a midpoint between the resistance value $R_{(1,1)}$ at the center of the resistance distribution characteristic part corresponding to the data value (1,1) and the resistance value $R_{(1,0)}$ at the center of the resistance distribution characteristic part corresponding to the data value (1,0), locate the resistance value Rb of the reference resistance element 111*b* at a midpoint between the resistance value $R_{(1,0)}$ at the center of the resistance distribution characteristic part corresponding to the data value (1,0) and the resistance value $R_{(0,1)}$ at the center of the resistance distribution characteristic part corresponding to the data value (0,1), and locate the resistance value Rc of the reference resistance element 111c at a midpoint between the resistance value $R_{(0,1)}$ at the center of the resistance distribution characteristic part corresponding to the data value (0,1) and the resistance value $R_{(0,0)}$ at the center of the resistance distribution characteristic part corresponding to the data value (0,0).

The above relationship will be generalized. When it is assumed that x is a positive integer value, a resistance value at a center of the x-th resistance distribution characteristic part having an x-th lowest resistance value is $R_x$, a resistance value at a center of the (x+1)-th resistance distribution characteristic part is $R_{x+1}$, and a resistance value of the reference resistance element having the resistance value between the resistance values $R_x$ and $R_{x+1}$ is $R_{refx-x+1}$, the following equation is satisfied.

$$\log R_{refx-x+1} = (\log R_x + \log R_{x+1})/2$$

Figure 10:
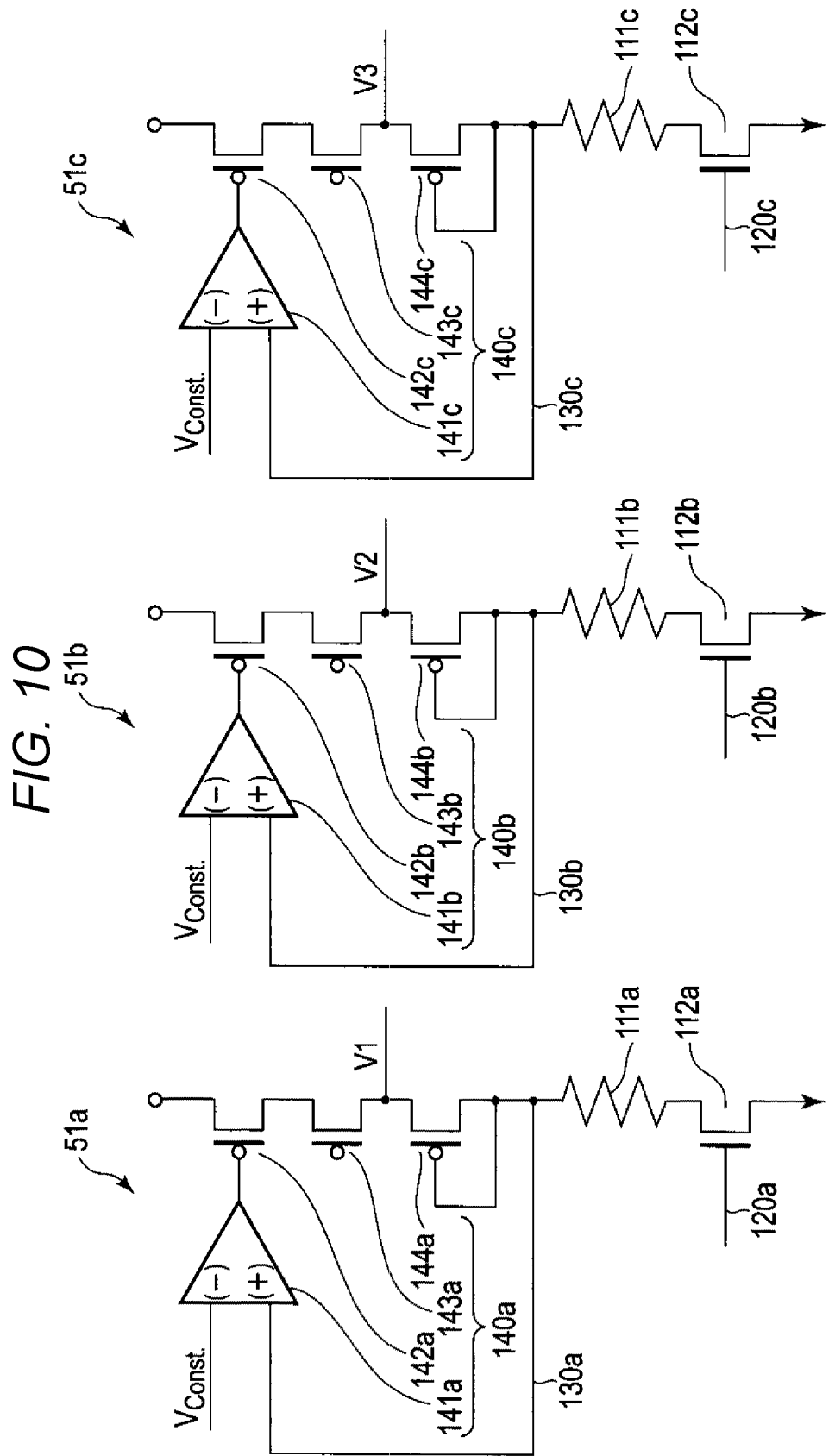
FIG. 10 is a circuit diagram depicting a configuration of a second modification of the reference voltage generation circuit block in the storage device according to the embodiment.

A basic configuration of a second modification depicted in FIG. 10 is similar to that of the first modification described above, and the reference voltage generation circuit block 51 includes the plurality of reference voltage generation circuits 51a, 51b, and 51c. In the present modification, differently from the first modification, PMOS transistors each having a gate and a drain connected to each other are used as the conversion elements 144a, 144b, and 144c. Furthermore, the conversion circuits 140a, 140b, and 140c have the same circuit configuration and the same circuit characteristic as those of the conversion circuit 40 depicted in FIG. 6.

Figure 11:
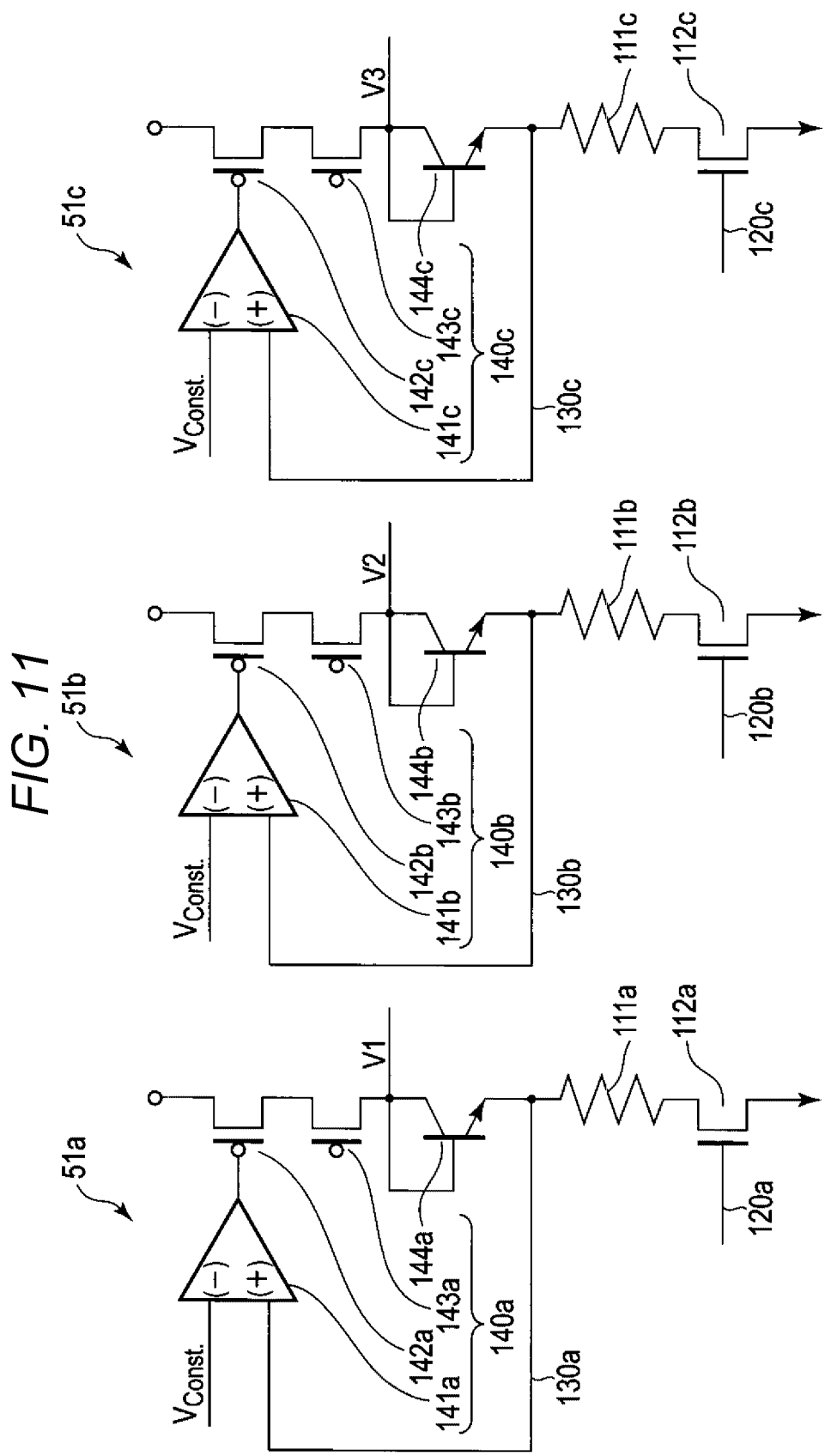
FIG. 11 is a circuit diagram depicting a configuration of a third modification of the reference voltage generation circuit block in the storage device according to the embodiment.

A basic configuration of a third modification depicted in FIG. 11 is similar to that of the first modification described above, and the reference voltage generation circuit block 51 includes the plurality of reference voltage generation circuits 51a, 51b, and 51c. In the present modification, unlike the first modification, bipolar transistors each having a base and a collector connected to each other are used as the conversion elements 144a, 144b, and 144c. Furthermore, the conversion circuits 140a, 140b, and 140c have the same circuit configuration and the same circuit characteristic as those of the conversion circuit 40 depicted in FIG. 7.

Figure 12:
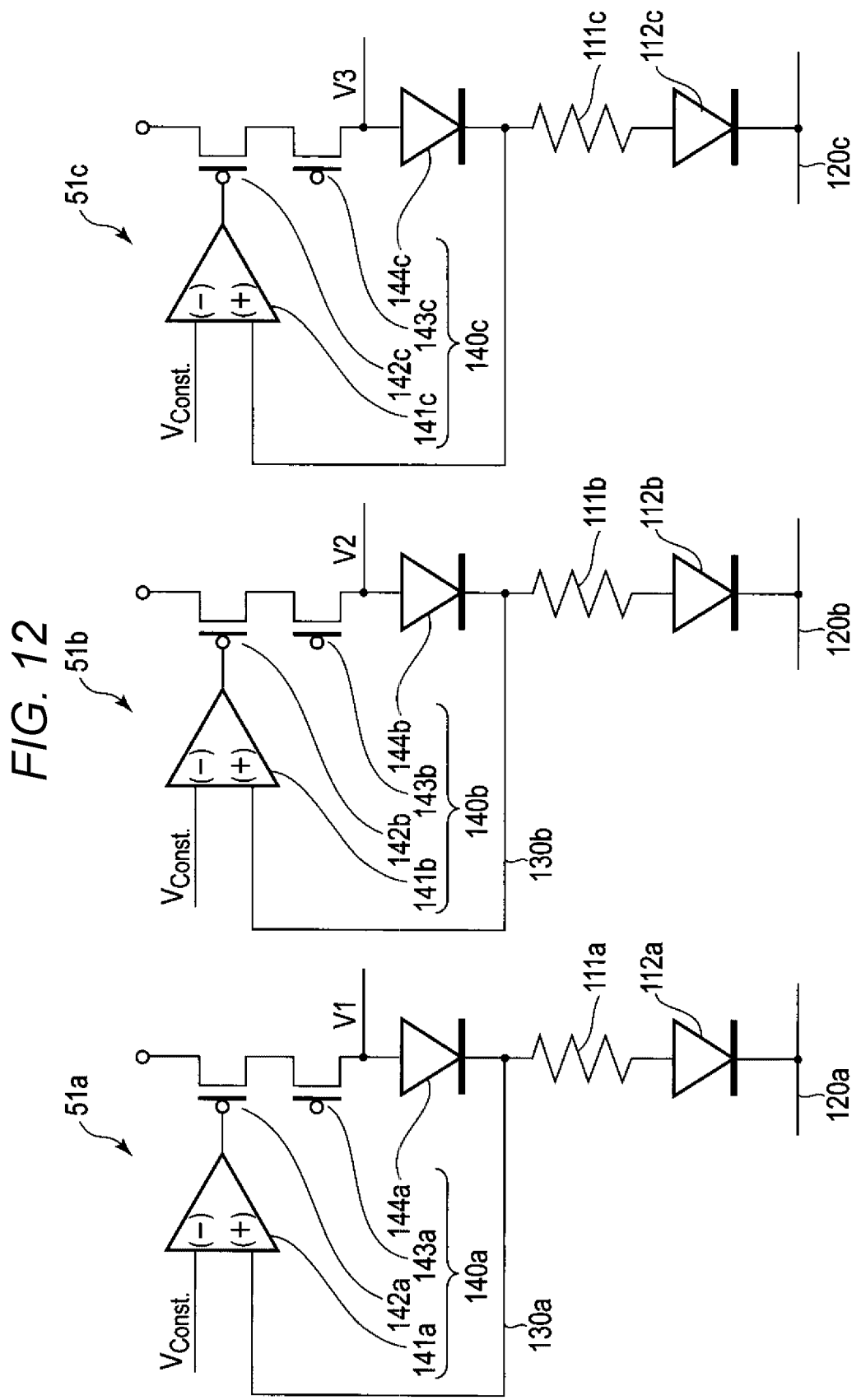
FIG. 12 is a circuit diagram depicting a configuration of a fourth modification of the reference voltage generation circuit block in the storage device according to the embodiment.

A basic configuration of a fourth modification depicted in FIG. 12 is similar to that of the first modification described above, and the reference voltage generation circuit block 51 includes the plurality of reference voltage generation circuits 51a, 51b, and 51c. In the present modification, unlike the first modification, two-terminal switching elements each having a nonlinear voltage-current characteristic are used as the reference selection elements 112a, 112b, and 112c. Selection elements similar to the selection element 12 depicted in FIG. 8 may be used as the reference selection elements 112a, 112b, and 112c. Furthermore, the conversion circuits 140a, 140b, and 140c have the same circuit configuration and the same circuit characteristic as those of the conversion circuit 40 depicted in FIG. 8.

The second, third, and fourth modifications described above can obtain similar advantages to those of the first modification.

Moreover, while the case of achieving the multivalued storage by repeating writing and verification using a type of a pulse waveform is described in the embodiment and the various modifications described above, the multivalued storage may be achieved by performing writing while a pulse waveform is changed in response to a write signal.

Furthermore, while the PCM element or the iPCM element is used as the resistance change storage element in the embodiment and the various modifications described above, an ReRAM (resistive random access memory) element or a CBRAM (conductive bridge random access memory) element may be used as the resistance change storage element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a memory cell including a storage component configured to set a plurality of data values in response to a plurality of resistance values of the storage component, and a selector connected in series to the storage component;
a word line configured to provide a signal to select the memory cell;
a bit line configured to receive a data signal from the memory cell;
a first conversion circuit configured to nonlinearly convert a first current, generated in response to the data signal input to the bit line, into a first voltage; and
a comparison circuit configured to compare the first voltage with at least one of a plurality of reference voltages.

2. The storage device according to claim 1, wherein the first conversion circuit configured to logarithmically convert the first current into the first voltage.

3. The storage device according to claim 1, wherein the first conversion circuit includes a two-terminal component having a nonlinear voltage-current characteristic.

4. The storage device according to claim 3, wherein the two-terminal component of the first conversion circuit includes a diode.

5. The storage device according to claim 3, wherein the selector of the memory cell is identical to the two-terminal component of the first conversion circuit.

6. The storage device according to claim 3, wherein the two-terminal component of the first conversion circuit contains a chalcogen element.

7. The storage device according to claim 3, wherein the first conversion circuit includes a diode-connected three-terminal component.

8. The storage device according to claim 1, wherein the plurality of resistance values of the storage component are configured to be set in response to a plurality of falling speeds of an applied voltage.

9. The storage device according to claim 1, wherein the storage component includes at least one of: a PCM (phase change memory) element, an iPCM (interfacial phase change memory) element, an ReRAM (resistive random access memory) element, or a CBRAM (conductive bridge random access memory) element.

10. The storage device according to claim 1, wherein the comparison circuit includes a plurality of reference voltage generation circuits configured to generate the plurality of reference voltages, respectively, and each of the plurality of reference voltage generation circuits includes:
  a reference resistor;
  a reference bit line to receive a second current from the reference resistor; and
a second conversion circuit that nonlinearly converts the second current into a second voltage.

11. The storage device according to claim 10, wherein each of the plurality of reference voltage generation circuits further includes:
  a reference selector connected in series to the reference resistor; and
  a reference word line configured to provide a signal to select the reference selector.

12. The storage device according to claim 10, wherein the second conversion circuit has an identical circuit configuration as the first conversion circuit.

13. The storage device according to claim 10, wherein a resistance distribution characteristic of the storage component includes a plurality of resistance distribution characteristic parts corresponding to the plurality of data values, respectively, and wherein each of the plurality of resistance values satisfies an equation, $$\log R_{refx-x+1} = (\log R_x + \log R_{x+1})/2,$$

where x is a positive integer value, a resistance value at a center of a x-th resistance distribution characteristic part is $R_x$, a resistance value at a center of a (x+1)-th resistance distribution characteristic part is $R_{x+1}$, a resistance value of the reference resistor between the resistance values $R_x$ and $R_{x+1}$ is $R_{refx-x+1}$.

14. A method, comprising:
  selecting a memory cell, the memory cell including a storage component configured to set a plurality of data values in response to a plurality of resistance values of the storage component, and a selector connected in series to the storage component;
  receiving a data signal from the memory cell;
  nonlinearly converting a first current, generated in response to the data signal input to a bit line, into a first voltage; and
  comparing the first voltage with at least one of a plurality of reference voltages to obtain one of the plurality of data values.

15. The method of claim 14, wherein the storage component includes at least one of: a PCM (phase change memory) element, an iPCM (interfacial phase change memory) element, an ReRAM (resistive random access memory) element, or a CBRAM (conductive bridge random access memory) element.

* * * * *